(12) United States Patent
Lin et al.

(10) Patent No.: US 12,222,451 B2
(45) Date of Patent: Feb. 11, 2025

(54) HEAT DISSIPATION FOR LIDAR SENSORS

(71) Applicant: Aurora Operations, Inc., Pittsburgh, PA (US)

(72) Inventors: Sen Lin, Santa Clara, CA (US); Lei Wang, Fremont, CA (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 0 days.

(21) Appl. No.: 18/184,260

(22) Filed: Mar. 15, 2023

(65) Prior Publication Data

US 2023/0213624 A1 Jul. 6, 2023

Related U.S. Application Data

(63) Continuation of application No. 17/530,925, filed on Nov. 19, 2021, now Pat. No. 11,619,714.

(60) Provisional application No. 63/117,310, filed on Nov. 23, 2020.

(51) Int. Cl.
| | |
|---|---|
| G01S 7/481 | (2006.01) |
| F21V 8/00 | (2006.01) |
| G01S 17/86 | (2020.01) |
| G01S 17/931 | (2020.01) |
| G02B 6/02 | (2006.01) |
| G02F 1/01 | (2006.01) |

(52) U.S. Cl.
CPC .......... *G01S 7/4818* (2013.01); *G01S 7/4813* (2013.01); *G01S 7/4814* (2013.01); *G01S 17/86* (2020.01); *G01S 17/931* (2020.01); *G02B 6/0085* (2013.01); *G02B 6/02* (2013.01); *G02F 1/0147* (2013.01)

(58) Field of Classification Search
None
See application file for complete search history.

(56) References Cited

U.S. PATENT DOCUMENTS

| | | |
|---|---|---|
| 9,740,079 B1 | 8/2017 | Davids et al. |
| 2003/0031445 A1 | 2/2003 | Parhami et al. |
| 2003/0048496 A1 | 3/2003 | Laming et al. |
| 2004/0264836 A1 | 12/2004 | Kawashima et al. |
| | (Continued) | |

FOREIGN PATENT DOCUMENTS

| | | |
|---|---|---|
| CN | 101529312 A | 9/2009 |
| JP | H 11337642 A | 12/1999 |
| | (Continued) | |

OTHER PUBLICATIONS

Website http://hyperphysics.phy-astr.gsu.edu/hbase/Tables/thrcn.html, accessed Jun. 12, 2024 (Year: 2024).*
International Searching Authority, Patent Cooperation Treaty, Written Opinion of the International Searching Authority, International Application No. PCT/US2021/060388, Notification Date: Mar. 14, 2022, 13 pages.

*Primary Examiner* — Eric L Bolda
(74) *Attorney, Agent, or Firm* — Dority & Manning, P.A.

(57) ABSTRACT

A light detection and ranging (LIDAR) device includes a substrate layer, a cladding layer, a waveguide, and an ohmic element. The cladding layer is disposed with the substrate layer. The waveguide runs through the cladding layer. The ohmic element runs through the cladding layer. The ohmic element is arranged to impart heat to the waveguide when an electrical current is driven through the ohmic element.

20 Claims, 12 Drawing Sheets

(56) References Cited

U.S. PATENT DOCUMENTS

| | | |
|---|---|---|
| 2005/0169566 A1* | 8/2005 | Takahashi ............... G02F 1/011 |
| | | 385/1 |
| 2009/0087137 A1 | 4/2009 | Doan |
| 2014/0321848 A1 | 10/2014 | Sekiguchi |
| 2015/0253510 A1 | 9/2015 | Celo |
| 2018/0024246 A1 | 1/2018 | Jeong et al. |
| 2018/0173024 A1 | 6/2018 | McGreer et al. |
| 2018/0173025 A1 | 6/2018 | McGreer et al. |
| 2018/0284286 A1* | 10/2018 | Eichenholz ............. G01S 17/89 |
| 2019/0004394 A1 | 1/2019 | Shin et al. |
| 2019/0219888 A1 | 7/2019 | Sun et al. |
| 2020/0124884 A1 | 4/2020 | Cardenas et al. |
| 2021/0109382 A1 | 4/2021 | Bovington |
| 2021/0318561 A1 | 10/2021 | Sakib et al. |

FOREIGN PATENT DOCUMENTS

| | | |
|---|---|---|
| JP | 2000056278 A | 2/2000 |
| JP | 2000206476 A | 7/2000 |
| JP | 2000258736 A | 9/2000 |
| JP | 2004077604 A | 8/2002 |
| JP | 2004037524 A | 2/2004 |
| JP | 2004280018 A | 10/2004 |
| JP | 2007078861 A | 3/2007 |
| JP | 2017521734 A | 8/2017 |
| KR | 20180010476 A | 1/2018 |
| WO | WO 2015/157963 A1 | 10/2015 |

\* cited by examiner

HEAT DISSIPATION FOR LIDAR SENSORS

PRIORITY CLAIM

The present application is a continuation of U.S. application Ser. No. 17/530,925 having a filing date of Nov. 19, 2021, which claims the benefit of U.S. provisional Application No. 63/117,310 filed Nov. 23, 2020. Applicant claims priority to and the benefit of each of such applications and incorporates all such applications herein by reference in its entirety.

TECHNICAL FIELD

This disclosure relates generally to optics and in particular to light detection and ranging (LIDAR).

BACKGROUND INFORMATION

Frequency Modulated Continuous Wave (FMCW) LIDAR directly measures range and velocity of an object by directing a frequency modulated, collimated light beam at a target. Both range and velocity information of the target can be derived from FMCW LIDAR signals. Designs and techniques to increase the accuracy of LIDAR signals are desirable.

The automobile industry is currently developing autonomous features for controlling vehicles under certain circumstances. According to SAE International standard J3016, there are 6 levels of autonomy ranging from Level 0 (no autonomy) up to Level 5 (vehicle capable of operation without operator input in all conditions). A vehicle with autonomous features utilizes sensors to sense the environment that the vehicle navigates through. Acquiring and processing data from the sensors allows the vehicle to navigate through its environment. Autonomous vehicles may include one or more LIDAR devices for sensing its environment.

BRIEF SUMMARY OF THE INVENTION

Implementations of the disclosure includes a light detection and ranging (LIDAR) device including a substrate layer, a cladding layer, a waveguide, and an ohmic element. The cladding layer is disposed with the substrate layer. At least a portion of the waveguide runs through the cladding layer. At least a portion of the ohmic element runs through the cladding layer. The ohmic element is arranged to impart heat to the waveguide in response to an electrical current that is provided to the ohmic element.

In an implementation, the substrate layer includes a void and the waveguide is disposed between the ohmic element and the void. The void in the substrate layer may include a polymer or a polyimide. The void in the substrate layer may include a dielectric. The void in the substrate layer may include one or more metals.

In an implementation, the waveguide has a higher refractive index than the cladding layer.

In an implementation, the ohmic element runs alongside the waveguide.

In an implementation, the LIDAR device includes a heat module configured to modulate a phase of light propagating through the waveguide by modulating the electrical current provided to the ohmic element.

In an implementation, the light propagating through the waveguide is infrared light.

In an implementation, the heat module is coupled to a first portion of the ohmic element and a second portion of the ohmic element that is opposite the first portion of the ohmic element.

In an implementation, a portion of the cladding layer is disposed between the waveguide and the ohmic element.

In an implementation, the substrate layer is a silicon substrate.

In an implementation, the cladding layer includes silicon dioxide.

In an implementation, the waveguide includes at least one of silicon dioxide, silicon, or silicon nitride.

In an implementation, the ohmic element includes at least one of a metal or a doped silicon.

Implementations of the disclosure include an autonomous vehicle control system for an autonomous vehicle including a LIDAR device and one or more processors. The LIDAR device includes a substrate layer, a cladding layer, a waveguide, and an ohmic element. The cladding layer is disposed with the substrate layer. At least a portion of the waveguide runs through the cladding layer. At least a portion of the ohmic element runs through the cladding layer. The ohmic element is arranged to impart heat to the waveguide in response to an electrical current that is provided to the ohmic element. An infrared transmit beam is configured to propagate through the waveguide and into an external environment of the autonomous vehicle. The one or more processors are configured to control the autonomous vehicle in response to an infrared returning beam that is a reflection of the infrared transmit beam.

In an implementation, the substrate layer includes a void and the waveguide is disposed between the ohmic element and the void.

In an implementation, the LIDAR device further includes a heat module configured to modulate a phase of the infrared transmit beam propagating through the waveguide by modulating the electrical current driven through the ohmic element.

Implementations of the disclosure include an autonomous vehicle including a LIDAR sensor and a control system. The LIDAR sensor includes a substrate layer, a cladding layer, a waveguide, and an ohmic element. The cladding layer is disposed with the substrate layer. The waveguide runs through the cladding layer. The ohmic element runs through the cladding layer. The ohmic element is arranged to impart heat to the waveguide in response to an electrical current that is provided to the ohmic element. An infrared transmit beam is configured to propagate through the waveguide and into an external environment of the autonomous vehicle. The control system is configured to control the autonomous vehicle in response to an infrared returning beam that is a reflection of the infrared transmit beam.

In an implementation, the autonomous vehicle further includes a heat module configured to modulate a phase of the infrared transmit beam propagating through the waveguide by modulating the electrical current driven through the ohmic element

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Implementations of heat dissipation designs in thermally controlled waveguides are described herein. In the following description, numerous specific details are set forth to provide a thorough understanding of the implementations. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one implementation" or "an implementation" means that a particular feature, structure, or characteristic described in connection with the implementation is included in at least one implementation of the present invention. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

Throughout this specification, several terms of art are used. These terms are to take on their ordinary meaning in the art from which they come, unless specifically defined herein or the context of their use would clearly suggest otherwise. For the purposes of this disclosure, the term "autonomous vehicle" includes vehicles with autonomous features at any level of autonomy of the SAE International standard J3016.

Temperature at optical waveguides may need to be manipulated to achieve desired functionalities, such as optical phase control. In an example context, the phase of light propagating through a waveguide may be changed due to the temperature of the waveguide. Thus, thermal behaviors such as thermal tuning efficiency and thermal bandwidth are important for certain applications and often require careful design and optimization.

Implementations of the disclosure include an ohmic element arranged to impart heat to a waveguide to control the phase properties of light propagating through the waveguide. The waveguide and the ohmic element run through a cladding layer and a void filled (or partially filled) with air, polymer, a dielectric, or metal may be disposed close to the waveguide to assist in controlling the temperature of the waveguide. Selecting a filler material to back-fill the void adjusts the heat dissipation rate of the waveguide to a particular design criteria. That is, varying the heat dissipation capability around the waveguide affects its thermal behavior.

Implementations of the disclosure may include a LIDAR device that includes waveguides that are selectively heated and cooled to modulate a phase of infrared light that is emitted by the LIDAR device. The LIDAR device may be included in an autonomous vehicle or a system for an autonomous vehicle.

Figure 1A:
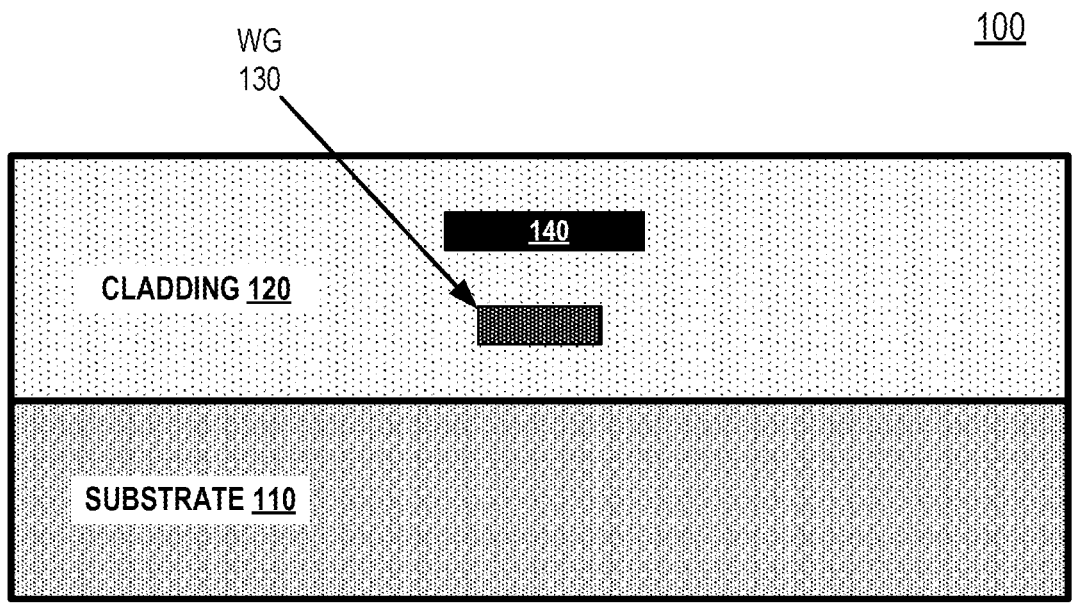
FIG. 1A illustrates an optical structure including a substrate layer, a cladding layer, a waveguide, and an ohmic element, in accordance with implementations of the disclosure.

FIG. 1A illustrates an optical structure 100 including a substrate layer 110, a cladding layer 120, a waveguide 130, and an ohmic element 140, in accordance with implementations of the disclosure. Substrate layer 110 may be a silicon substrate. Cladding layer 120 is disposed with substrate layer 110 and may include silicon dioxide. Cladding layer 120 may contact substrate layer 110. Cladding layer 120 may be grown or deposited onto substrate layer 110. Cladding layer 120 may be bonded to substrate layer 110. Waveguide 130 runs through cladding layer 120 (in an out of the page) and may include silicon dioxide, silicon, or silicon nitride. Waveguide 130 has a higher refractive index than cladding layer 120. Ohmic element 140 may include a metal (e.g. copper) or doped silicon. Ohmic element 140 runs through cladding layer 120 and is arranged (or positioned) to impart heat to waveguide 130 in response to an electrical current provided to (e.g. driven through) the ohmic element 140.

Figure 1B:
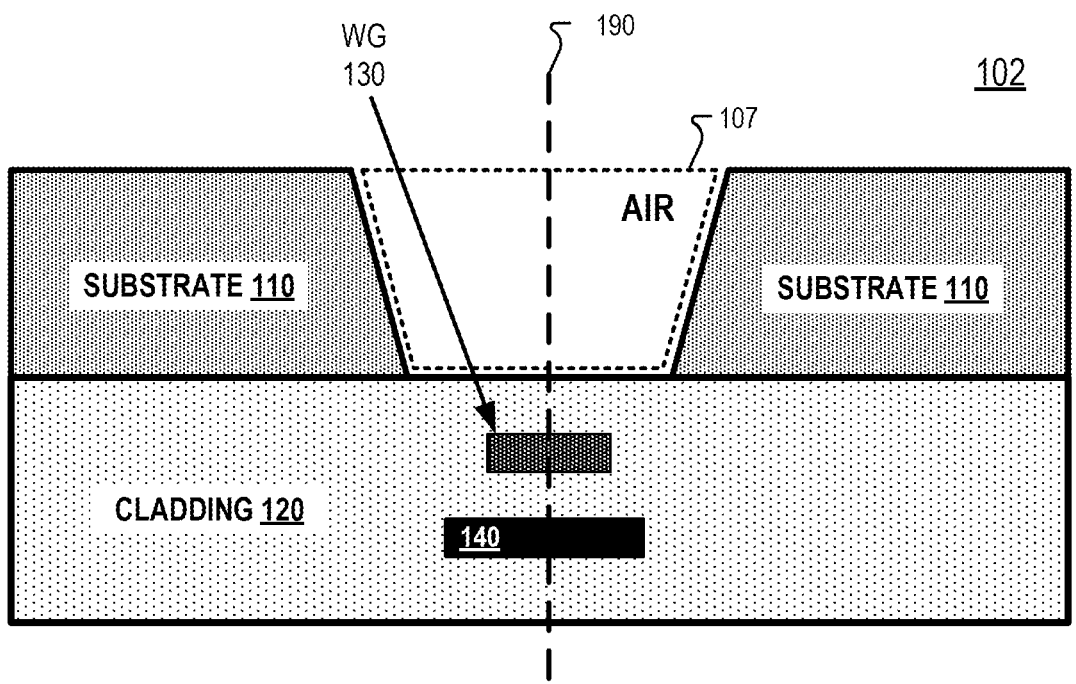
FIG. 1B illustrates an optical structure where a void has been formed in the substrate layer of the optical structure, in accordance with implementations of the disclosure.

FIG. 1B illustrates an optical structure 102 where a void 107 has been formed in the substrate layer 110 of optical structure 100, in accordance with implementations of the disclosure. To form void 107 in optical structure 100, the substrate layer 110 (e.g. silicon wafer) may be flipped and one or more voids 107 may be etched in substrate layer 110. Plasma etch techniques or anisotropic chemical etching may be used to form void 107, in some implementations. Waveguide 130 is disposed between ohmic element 140 and the void 107 in substrate layer 110, in FIG. 1B. Void 107 is filled with air or other gas in the specific illustration of FIG. 1B. When silicon is uses as substrate layer 110, forming void 107 substantially reduces the heat dissipation from waveguide 130 since the thermal conductivity of silicon is approximately 160 W/mk and the thermal conductivity of air is 0.025 W/mK. In implementations of the disclosure, void 107 may be left as an air-gap or include (e.g. filled or partially filled with) materials such as polymers, dielectrics, and/or metal to control the heat dissipation from waveguide 130.

Figure 1C:
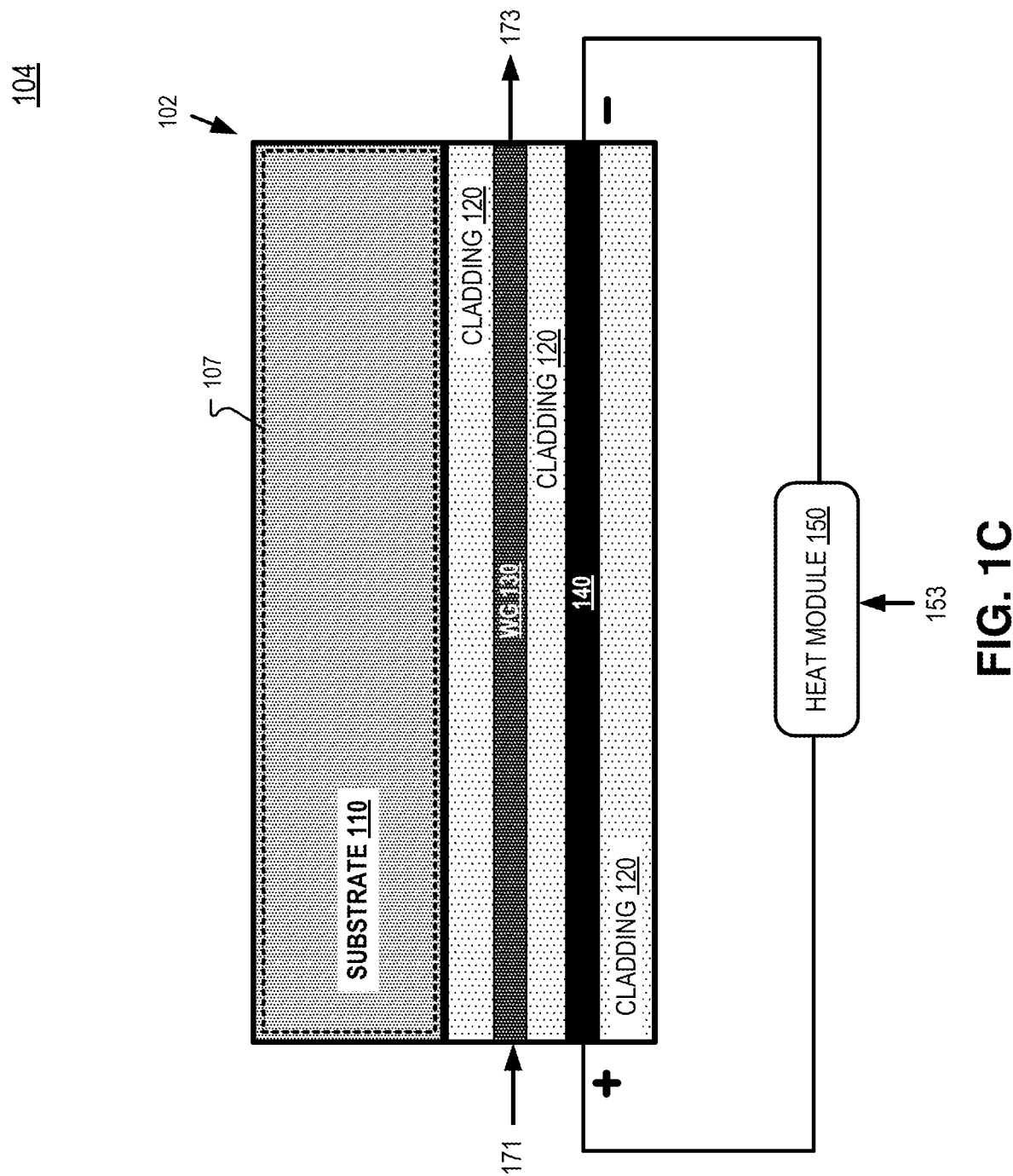
FIG. 1C illustrates a device including an optical structure and a heat module, in accordance with implementations of the disclosure.

FIG. 1C illustrates a device 104 including optical structure 102 and a heat module 150, in accordance with implementations of the disclosure. FIG. 1C includes a side view of optical structure 102 sliced along plane 190 in FIG. 1B. Substrate layer 110 is viewable behind void 107 as void 107 is filled with air. FIGS. 1B and 1C illustrate that a portion of cladding layer 120 is disposed between waveguide 130 and ohmic element 140. In the illustrations of FIGS. 1B and 1C, ohmic element 140 runs alongside waveguide 130, although in other implementations, ohmic element 140 may not necessarily run alongside waveguide 130.

Heat module 150 drives an electrical current through ohmic element 140 in response to a thermal signal 153, in FIG. 1C. Thermal signal 153 may be an analog or digital control signal. Heat module 150 may include one or more transistors. Heat module 150 is coupled to opposite ends of ohmic element 140 to drive an electrical current through ohmic element 140 in order to impart heat to waveguide 130. Thus, heat module 150 may be coupled to a first portion of ohmic element 140 and a second portion of ohmic element 140 that is opposite the first portion of ohmic element 140. A voltage potential may exist across ohmic element 140. Heating or cooling waveguide 130 may change the phase of light propagating through waveguide 130. In FIG. 1C, input light 171 is received by waveguide 130 at an input end of waveguide 130. Input light 171 propagates through waveguide 130 and exits the output end as output light 173. The phase of output light 173 may change depending on the heat imparted to waveguide 130 by ohmic element 140. Thus, heat module 150 may be configured to modulate a phase of light propagating through waveguide 130 by modulating the electrical current driven through ohmic element 140. Light 171 may be infrared light. Light 171 may be near-infrared light.

Figure 2A:
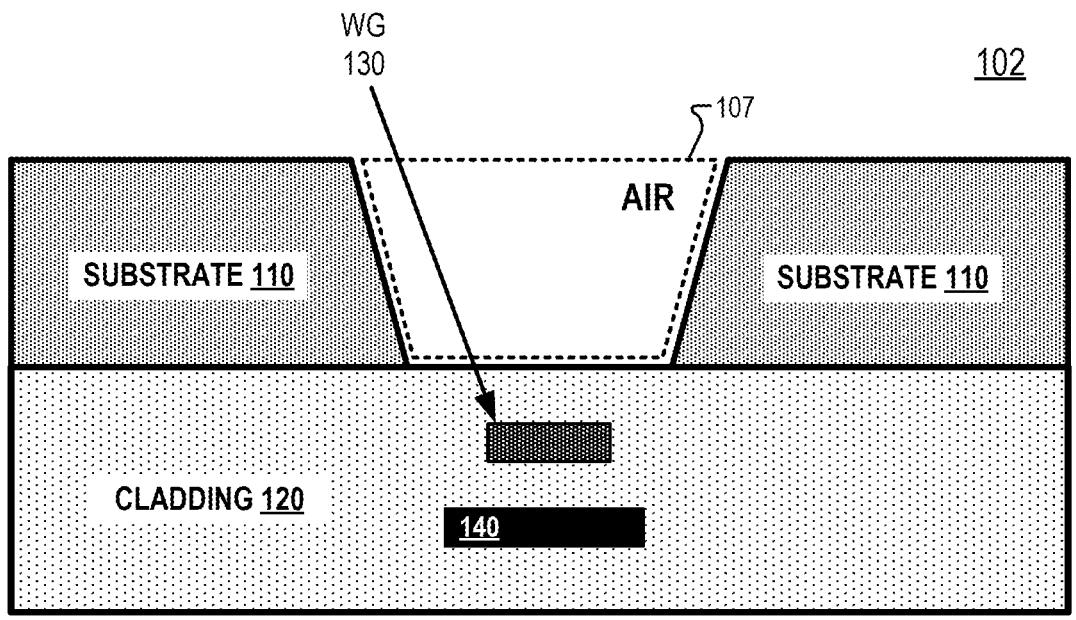
FIGS. 2A-2C illustrate a polymer material being formed in a void, in accordance with implementations of the disclosure.
Figure 2B:
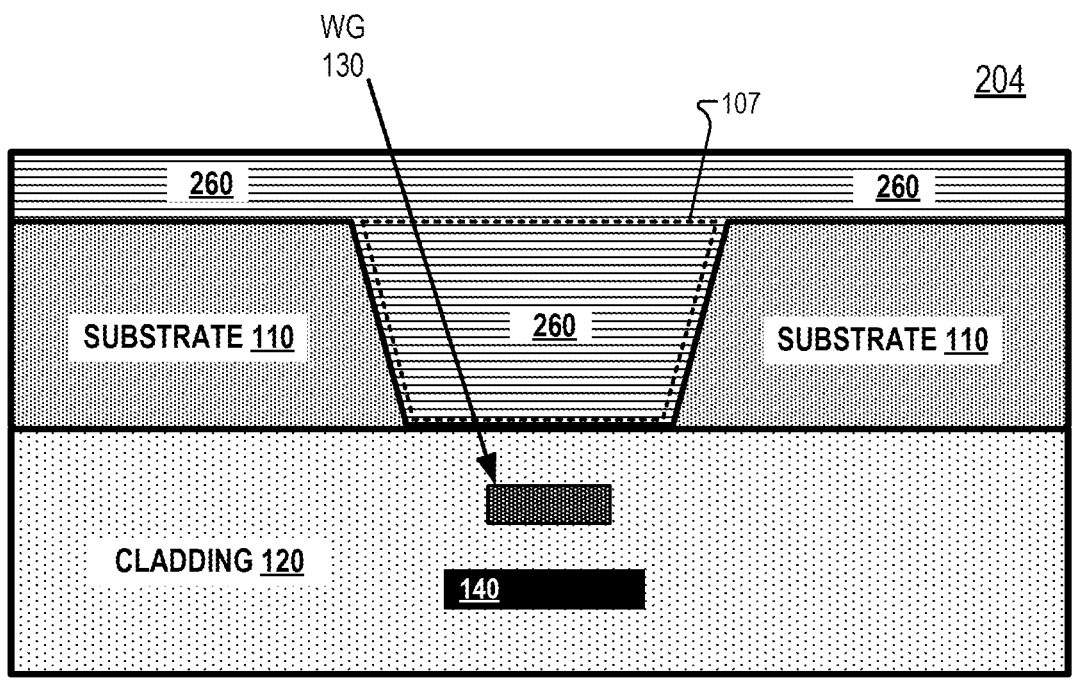
Figure 2C:
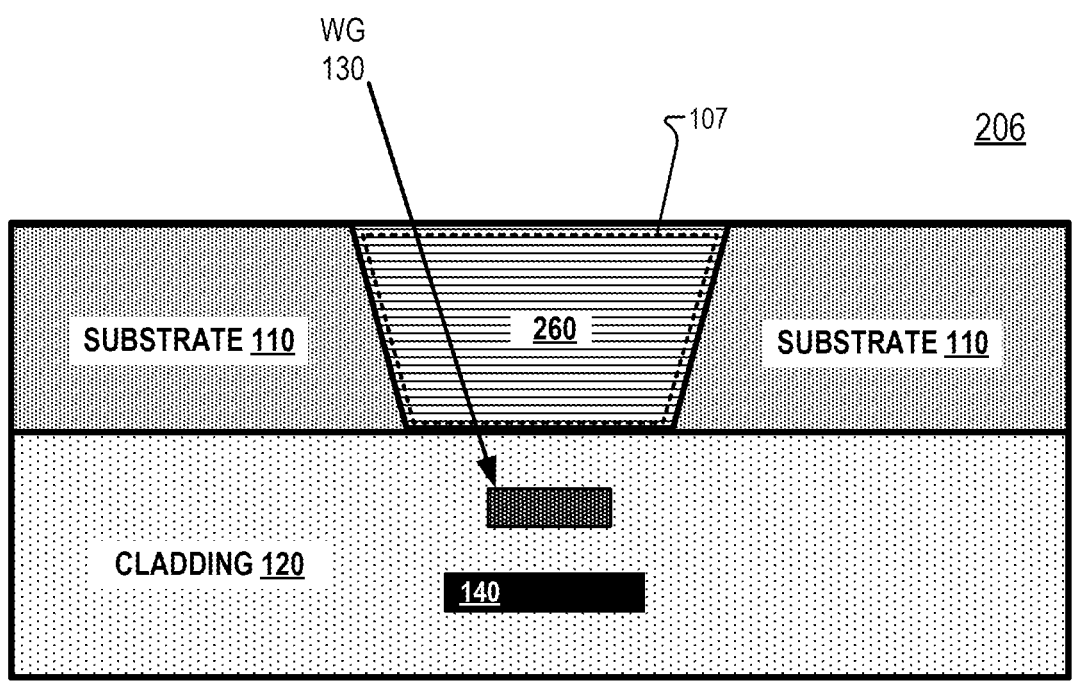

FIGS. 2A-2C illustrate a polymer material 260 being formed in void 107, in accordance with implementations of the disclosure. FIG. 2A illustrates optical structure 102. FIG. 2B illustrates that a polymer material 260 may be formed in void 107 of optical structure 102 to form optical structure 204. Forming polymer material 260 may include flipping the wafer of optical structure 102 and spin coating a photosensitive polymers such as polyimide or benzocyclobutene-based polymer onto optical structure 102. FIG. 2C illustrates that portions of polymer material 260 have been removed to leave polymer material 260 filling void 107 in optical structure 206. The top of polymer material 260 may be planar with the top of substrate layer 110, in FIG. 2C. Generating optical structure 206 from optical structure 204 may include photolithography techniques to pattern and remove excessive polymer material 260, for example.

Figure 3A:
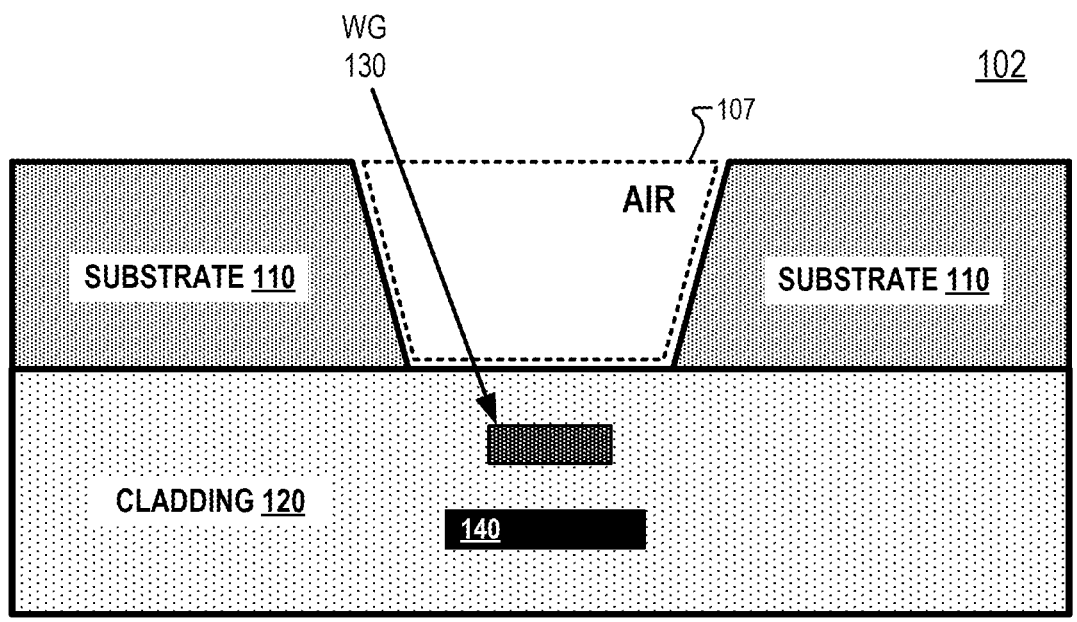
FIGS. 3A-3C illustrate a dielectric material being formed in a void, in accordance with implementations of the disclosure.
Figure 3B:
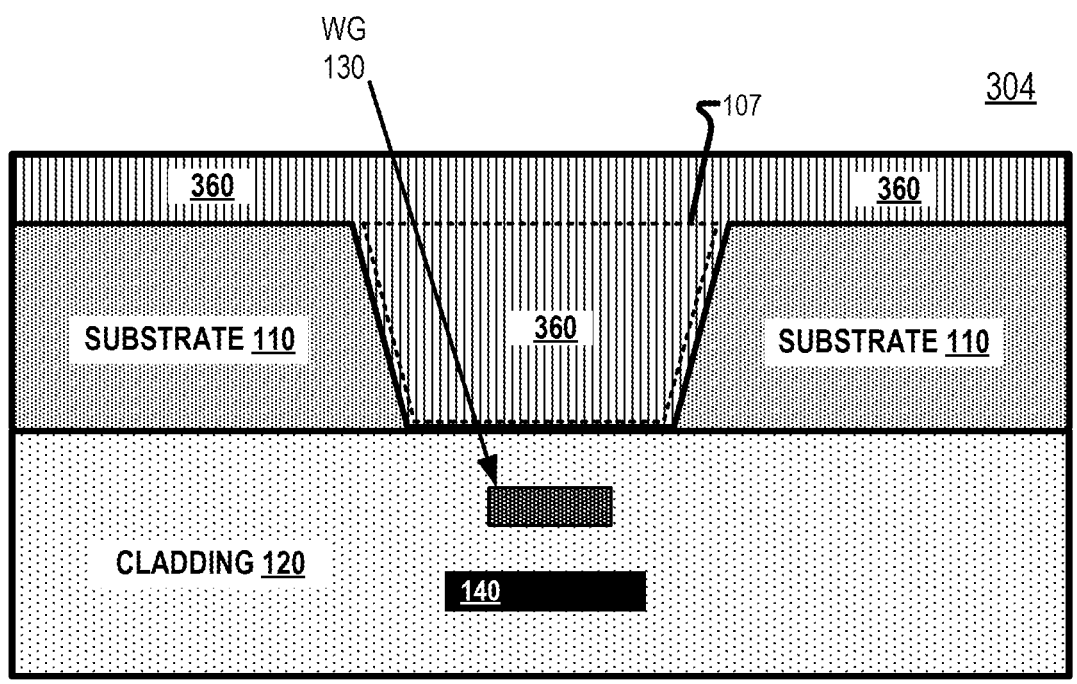
Figure 3C:
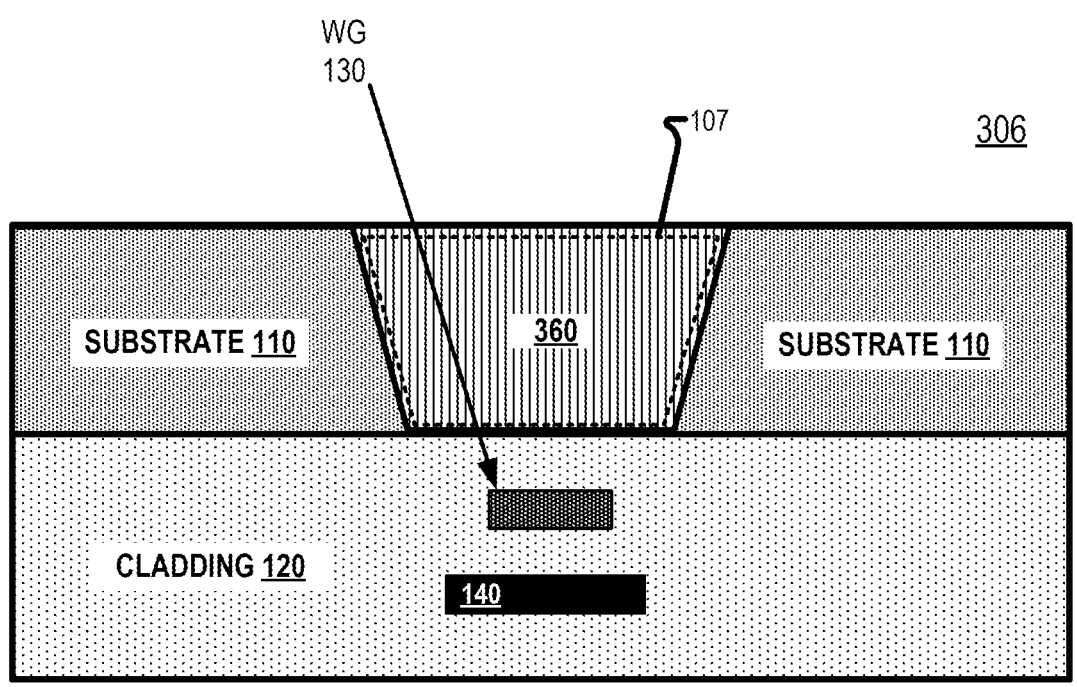

FIGS. 3A-3C illustrate a dielectric material 360 being formed in void 107, in accordance with implementations of the disclosure. FIG. 3A illustrates optical structure 102. FIG. 3B illustrates that a dielectric material 360 may be formed in void 107 of optical structure 102 to form optical structure 304. Forming dielectric material 360 may include flipping the wafer of optical structure 102 and depositing dielectric material 360 (e.g. silicon oxide) onto optical structure 102. A flame hydrolysis deposition technique may be used to deposit the dielectric material 360 onto optical structure 102, for example. FIG. 3C illustrates that portions of dielectric material 360 have been removed to leave dielectric material 360 filling void 107 in optical structure 306. The top of dielectric material 360 may be planar with the top of substrate layer 110, in FIG. 3C. Generating optical structure 306 from optical structure 304 may include chemical-mechanical-polishing (CMP) to remove excessive dielectric material 360 to planarize the wafer, for example.

Figure 4A:
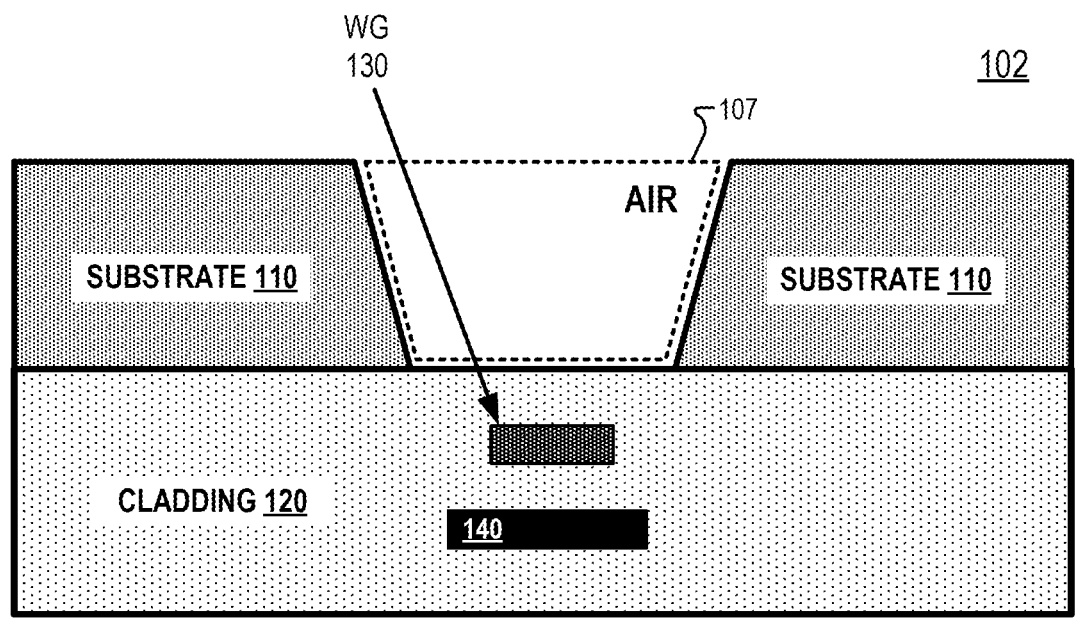
FIGS. 4A-4E illustrate a metal being formed in a void, in accordance with implementations of the disclosure.
Figure 4B:
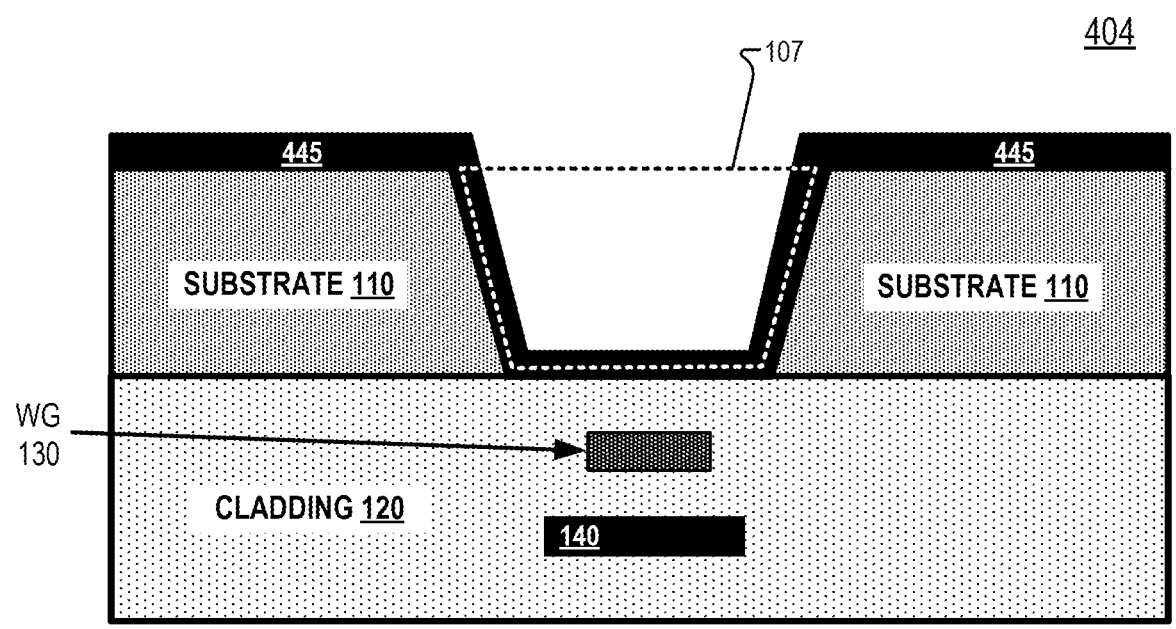

FIGS. 4A-4E illustrate a metal 460 being formed in void 107, in accordance with implementations of the disclosure. FIG. 4A illustrates optical structure 102. FIG. 4B illustrates a metal film layer 445 disposed over substrate layer 110 and in void 107 of optical structure 102 to form optical structure 404. Metal film layer 445 is also formed on the bottom of void 107 and on sidewalls of void 107. In an implementation, metal film layer 445 is copper. Forming metal film layer 445 may include electro-plating the metal film layer 445 on optical structure 102. Metal film layer 445 serves as a seed layer for filling void 107 with subsequent metal material.

Figure 4C:
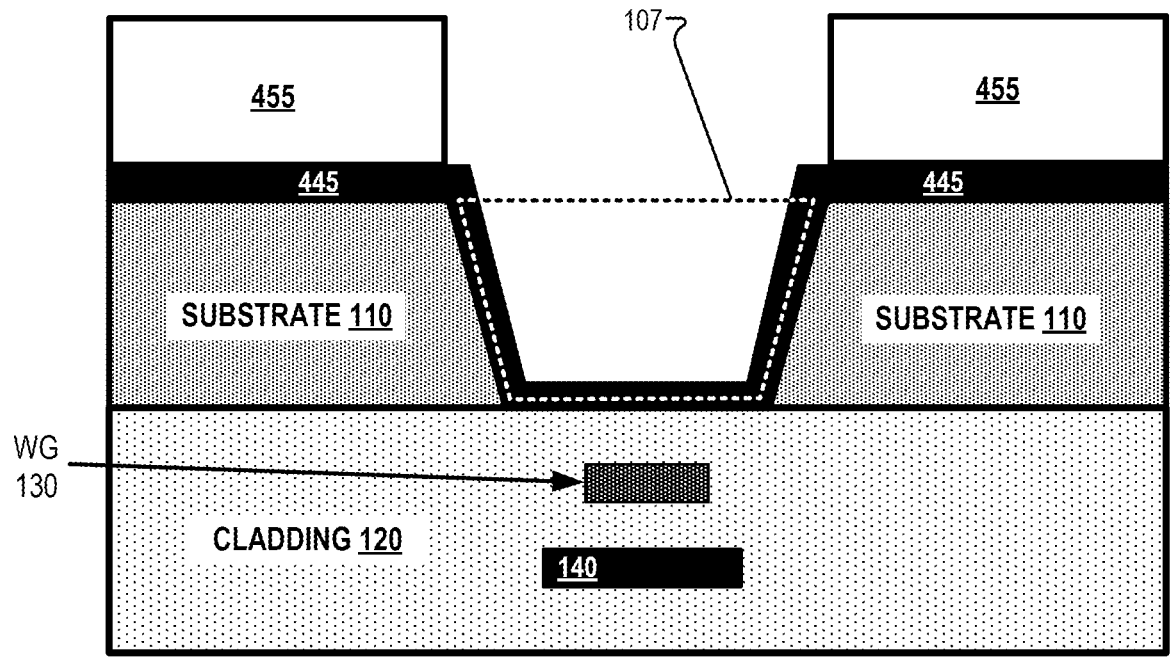
Figure 4D:
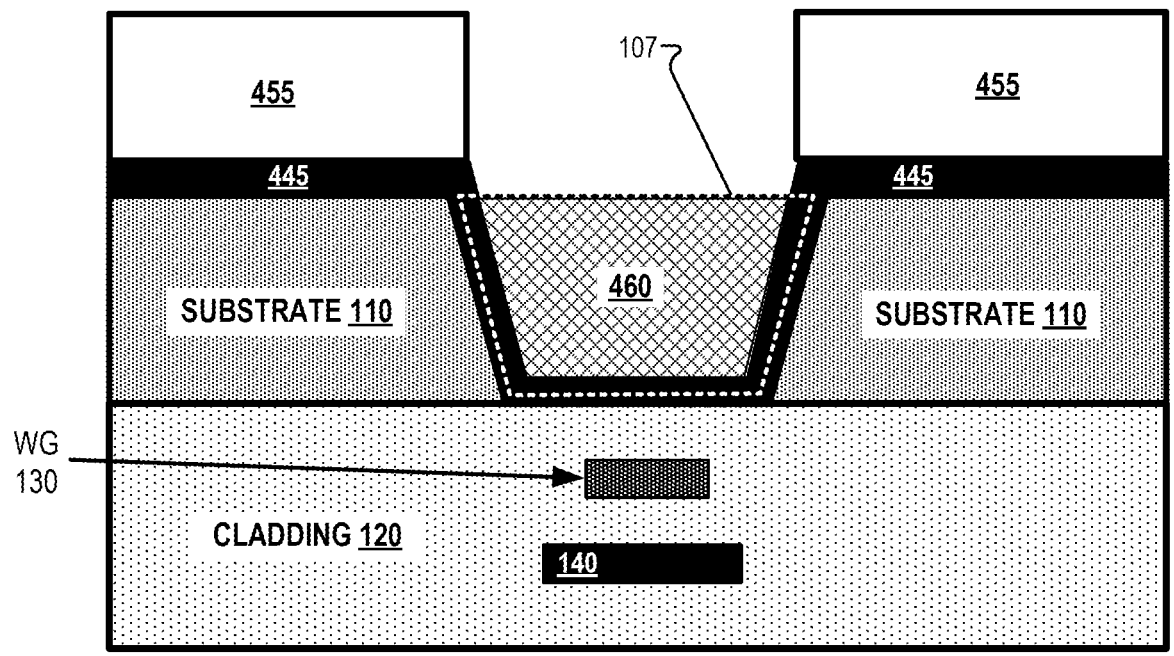
Figure 4E:
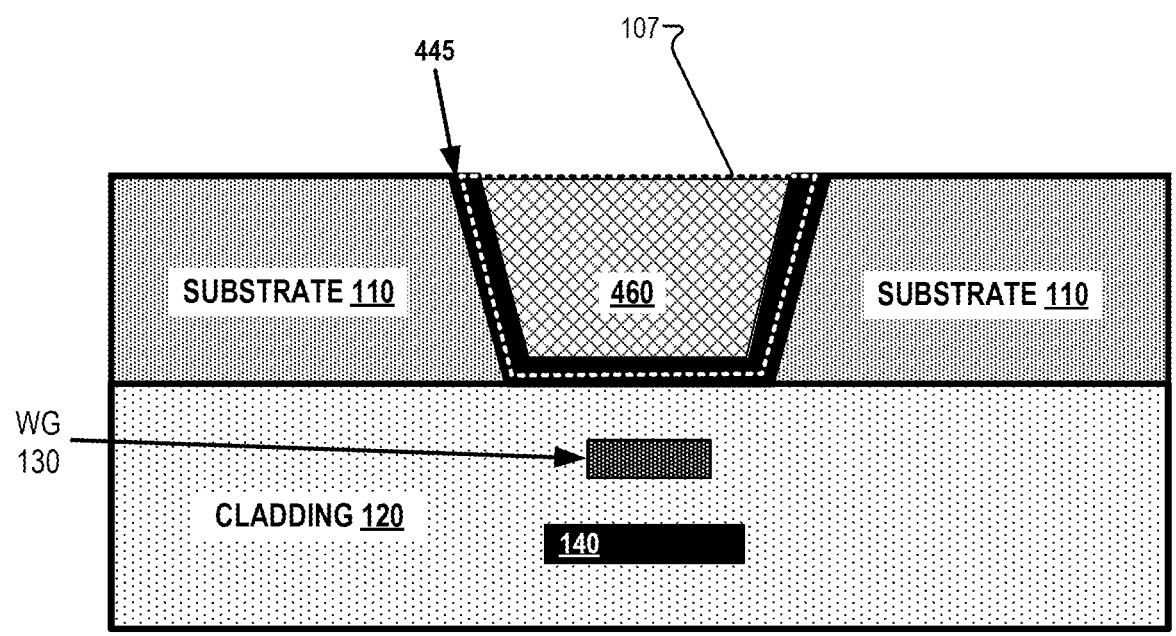

FIG. 4C illustrates an optical structure 406 formed by patterning photoresist 455 onto optical structure 404. Photolithography techniques may be used to pattern photoresist 455, in some implementations. FIG. 4D illustrates that an additional metal material 460 is formed in void 107 of optical structure 406 to form optical structure 408. Metal 460 may be formed by electro-plating processes, in some implementations. Metal 460 may be copper or nickel-iron (NiFe), in implementations of the disclosure. FIG. 4E illustrates an optical structure 410. Optical structure 410 may be formed by removing the photoresist 455 from optical structure 408 and the portion of metal film layer 445 that rests on substrate layer 110. Removing the photoresist 455 may include stripping the photoresist 455 and removing metal film layer 445 may include an etching process.

Optical structures 102, 206, 306, and 410 illustrate that void 107 may be filled or partially filled with air (or other gas), polymers, dielectrics, or metals. Thus, different heat dissipation rates can be designed into different optical structures to select the heat dissipation rate that meets the design goals. In some implementations, the thermal conductivity of the material included in the void 107 is between 0.1 W/mK and 1 W/mK. In some implementations, the thermal conductivity of the material that is included in the void 107 is between 1 W/mK and 2 W/mK. In some implementations, the thermal conductivity of the material that is included in the void 107 is between 2 W/mK and 10 W/mK. In some implementations, the thermal conductivity of the material that is included in the void 107 is between 10 W/mK and 100 W/mK. In some implementations, the thermal conductivity of the material that is included in the void 107 is between 100 W/mK and 500 W/mK. A polyimide having a thermal conductivity of 0.12 W/mK is the fill material, in some implementations. Silicon oxide having a thermal conductivity of 1.4 W/mK is the fill material, in some implementations. A nickel-iron alloy having a thermal conductivity of 17 W/mK is the fill material, in some implementations. Copper having a thermal conductivity of 390 W/mK is the fill material, in some implementations.

Optical structures 102, 206, 306, and 410 may be considered a photonic integrated circuit (PIC) on a Silicon-on-Insulator (SOI) wafer when a silicon wafer is used as substrate layer 110. It is understood that in implementations of the disclosures, optical structures 206, 306, and 410 may have heat modules similar to heat module 150 coupled to the ohmic element 140 to modulate an electrical current through ohmic element(s) in response to a thermal signal 153 in order to modulate the heat imparted to waveguide 130 in optical structures 206, 306, and 410.

Figure 5A:
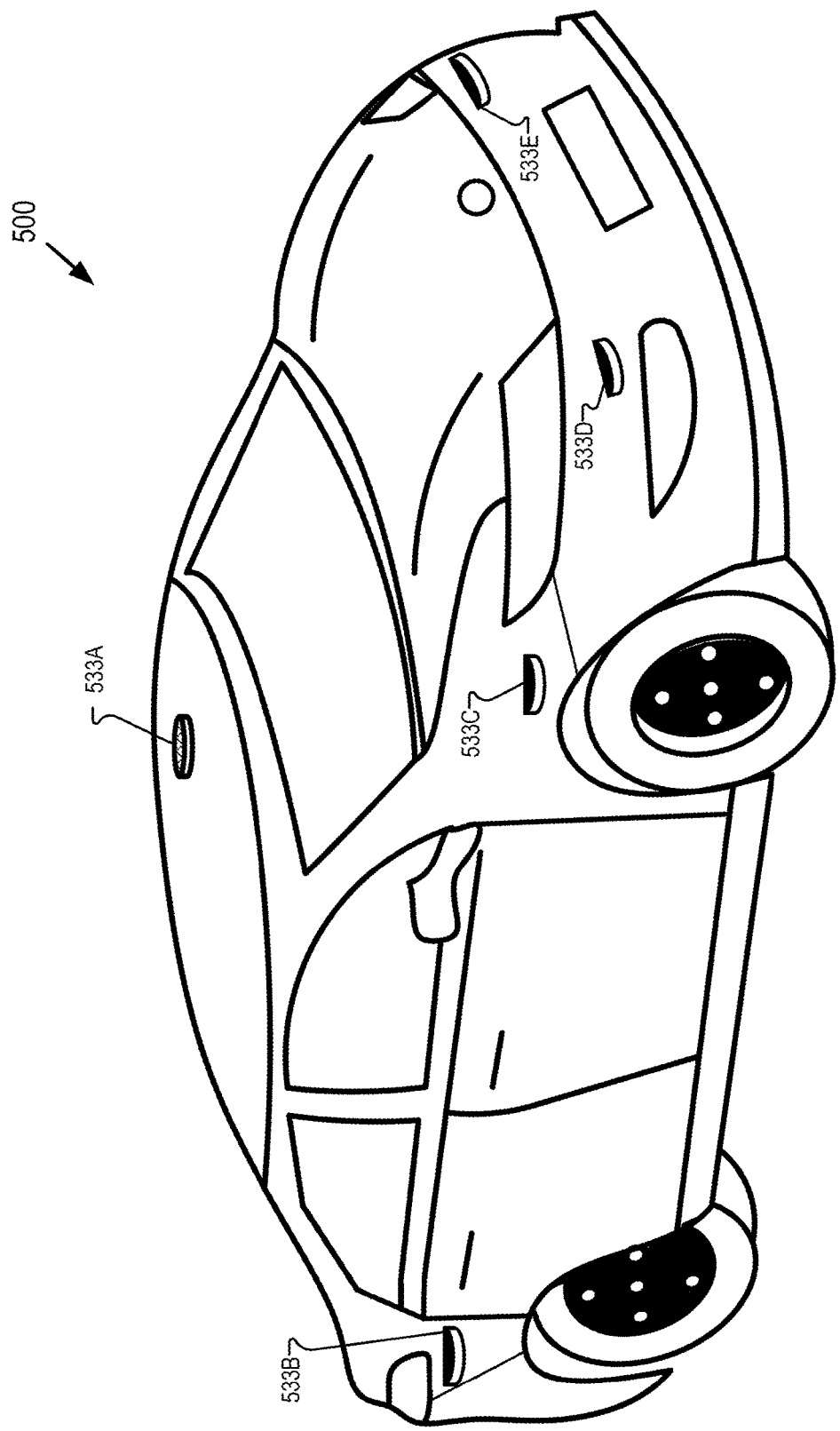
FIG. 5A illustrates an autonomous vehicle including an array of example sensors, in accordance with implementations of the disclosure.
Figure 5B:
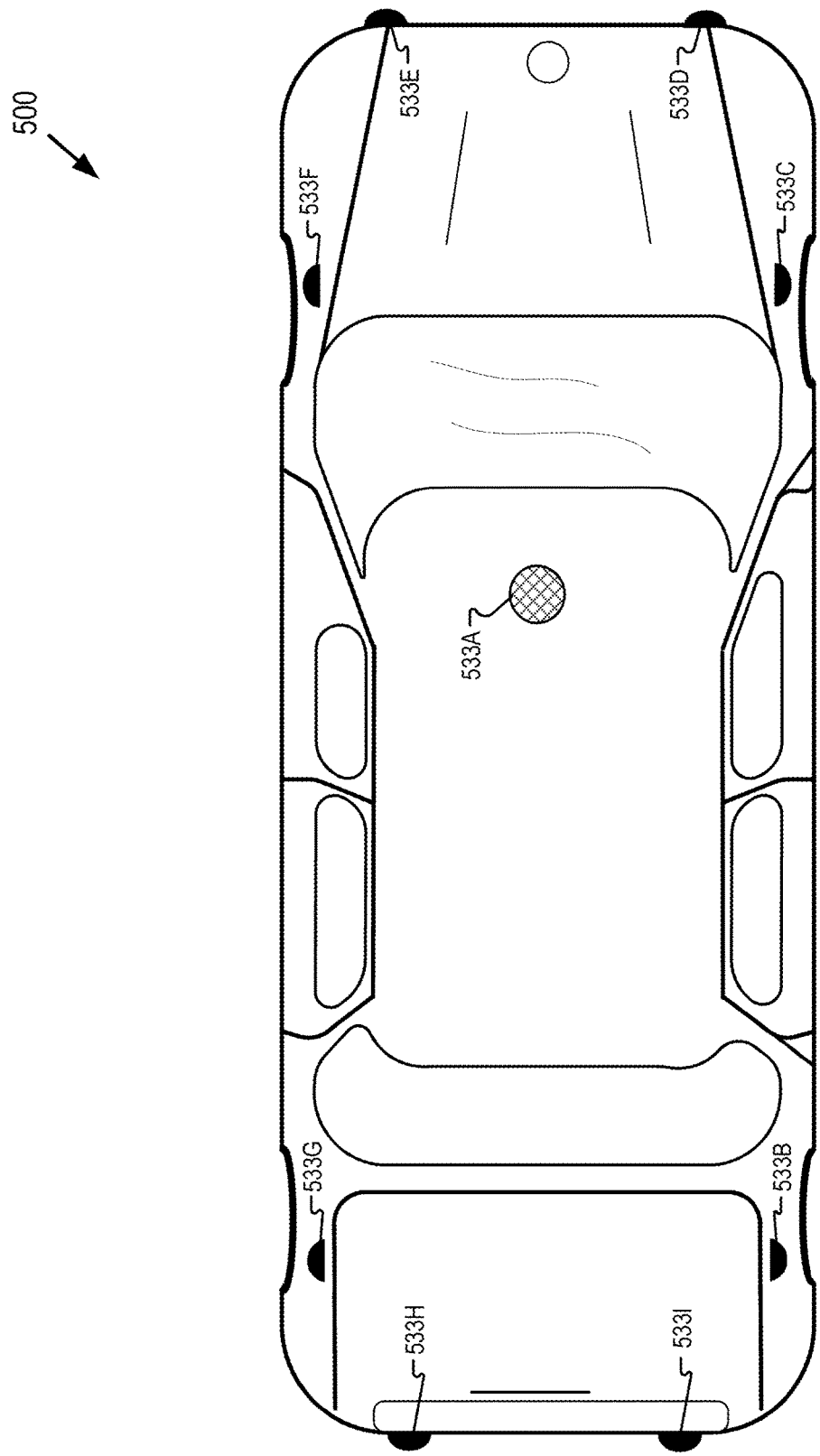
FIG. 5B illustrates a top view of an autonomous vehicle including an array of example sensors, in accordance with implementations of the disclosure.
Figure 5C:
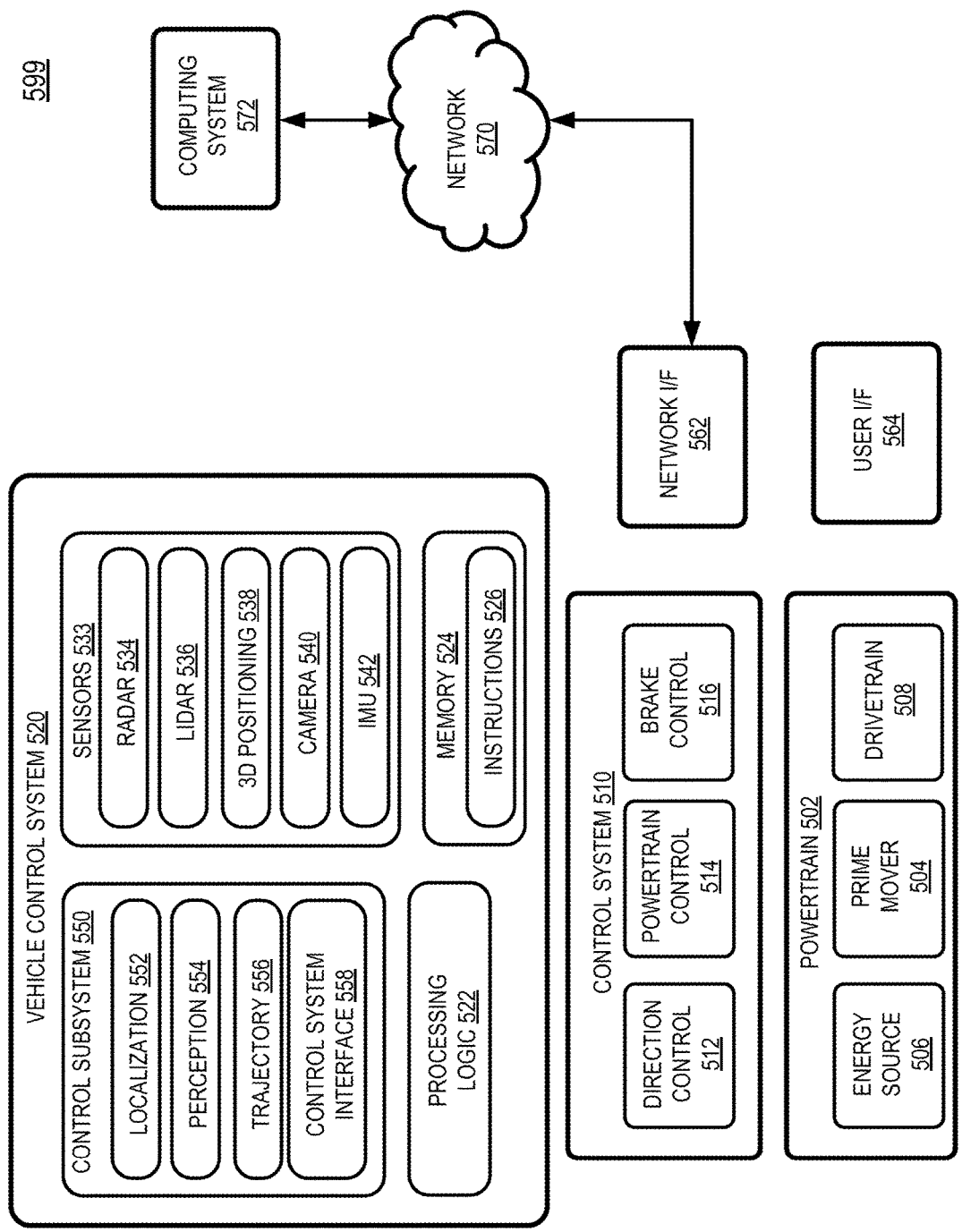
FIG. 5C illustrates an example vehicle control system including sensors, a drivetrain, and a control system, in accordance with implementations of the disclosure.

FIG. 5A illustrates an example autonomous vehicle 500 that may include the optical structures of FIGS. 1A-4E in a LIDAR device, in accordance with aspects of the disclosure. The illustrated autonomous vehicle 500 includes an array of sensors configured to capture one or more objects of an external environment of the autonomous vehicle and to generate sensor data related to the captured one or more objects for purposes of controlling the operation of autonomous vehicle 500. FIG. 5A shows sensor 533A, 533B, 533C, 533D, and 533E. FIG. 5B illustrates a top view of autonomous vehicle 500 including sensors 533F, 533G, 533H, and 533I in addition to sensors 533A, 533B, 533C, 533D, and 533E. Any of sensors 533A, 533B, 533C, 533D, 533E, 533F, 533G, 533H, and/or 533I may include LIDAR devices that include the designs of FIGS. 1A-4E. FIG. 5C illustrates a block diagram of an example system 599 for autonomous vehicle 500. For example, autonomous vehicle 500 may include powertrain 502 including prime mover 504 powered by energy source 506 and capable of providing power to drivetrain 508. Autonomous vehicle 500 may further include control system 510 that includes direction control 512, powertrain control 514, and brake control 516. Autonomous vehicle 500 may be implemented as any number of different vehicles, including vehicles capable of transporting people and/or cargo and capable of traveling in a variety of different environments. It will be appreciated that the aforementioned components 502-516 can vary widely based upon the type of vehicle within which these components are utilized.

The implementations discussed hereinafter, for example, will focus on a wheeled land vehicle such as a car, van, truck, or bus. In such implementations, prime mover 504 may include one or more electric motors and/or an internal combustion engine (among others). The energy source may include, for example, a fuel system (e.g., providing gasoline, diesel, hydrogen), a battery system, solar panels or other renewable energy source, and/or a fuel cell system. Drivetrain 508 may include wheels and/or tires along with a transmission and/or any other mechanical drive components suitable for converting the output of prime mover 504 into vehicular motion, as well as one or more brakes configured to controllably stop or slow the autonomous vehicle 500 and direction or steering components suitable for controlling the trajectory of the autonomous vehicle 500 (e.g., a rack and pinion steering linkage enabling one or more wheels of autonomous vehicle 500 to pivot about a generally vertical axis to vary an angle of the rotational planes of the wheels relative to the longitudinal axis of the vehicle). In some implementations, combinations of powertrains and energy sources may be used (e.g., in the case of electric/gas hybrid vehicles). In some implementations, multiple electric motors (e.g., dedicated to individual wheels or axles) may be used as a prime mover.

Direction control 512 may include one or more actuators and/or sensors for controlling and receiving feedback from the direction or steering components to enable the autonomous vehicle 500 to follow a desired trajectory. Powertrain control 514 may be configured to control the output of powertrain 502, e.g., to control the output power of prime mover 504, to control a gear of a transmission in drivetrain 508, thereby controlling a speed and/or direction of the autonomous vehicle 500. Brake control 516 may be configured to control one or more brakes that slow or stop autonomous vehicle 500, e.g., disk or drum brakes coupled to the wheels of the vehicle.

Other vehicle types, including but not limited to off-road vehicles, all-terrain or tracked vehicles, or construction equipment will necessarily utilize different powertrains, drivetrains, energy sources, direction controls, powertrain controls, and brake controls, as will be appreciated by those of ordinary skill having the benefit of the instant disclosure. Moreover, in some implementations some of the components can be combined, e.g., where directional control of a vehicle is primarily handled by varying an output of one or more prime movers. Therefore, implementations disclosed herein are not limited to the particular application of the herein-described techniques in an autonomous wheeled land vehicle.

In the illustrated implementation, autonomous control over autonomous vehicle 500 is implemented in vehicle control system 520, which may include one or more processors in processing logic 522 and one or more memories 524, with processing logic 522 configured to execute program code (e.g. instructions 526) stored in memory 524. Processing logic 522 may include graphics processing unit(s) (GPUs) and/or central processing unit(s) (CPUs), for example. Vehicle control system 520 may be configured to control powertrain 502 of autonomous vehicle 500 in response to the infrared returning beams that are a reflection of an infrared transmit beam that propagated through waveguide(s) 130 into an external environment of autonomous vehicle 500 and reflected back to a receive LIDAR pixel.

Sensors 533A-533I may include various sensors suitable for collecting data from an autonomous vehicle's surrounding environment for use in controlling the operation of the autonomous vehicle. For example, sensors 533A-533I can include RADAR unit 534, LIDAR unit 536, 3D positioning sensor(s) 538, e.g., a satellite navigation system such as GPS, GLONASS, BeiDou, Galileo, or Compass. The LIDAR designs of FIGS. 1A-4E may be included in LIDAR unit 536. LIDAR unit 536 may include a plurality of LIDAR sensors that are distributed around autonomous vehicle 500, for example. In some implementations, 3D positioning sensor(s) 538 can determine the location of the vehicle on the Earth using satellite signals. Sensors 533A-533I can optionally include one or more ultrasonic sensors, one or more cameras 540, and/or an Inertial Measurement Unit (IMU) 542. In some implementations, camera 540 can be a monographic or stereographic camera and can record still and/or video images. Camera 540 may include a Complementary Metal-Oxide-Semiconductor (CMOS) image sensor configured to capture images of one or more objects in an external environment of autonomous vehicle 500. IMU 542 can include multiple gyroscopes and accelerometers capable of detecting linear and rotational motion of autonomous vehicle 500 in three directions. One or more encoders (not illustrated) such as wheel encoders may be used to monitor the rotation of one or more wheels of autonomous vehicle 500.

The outputs of sensors 533A-533I may be provided to control subsystems 550, including, localization subsystem 552, trajectory subsystem 556, perception subsystem 554, and control system interface 558. Localization subsystem 552 is configured to determine the location and orientation (also sometimes referred to as the "pose") of autonomous vehicle 500 within its surrounding environment, and generally within a particular geographic area. The location of an autonomous vehicle can be compared with the location of an additional vehicle in the same environment as part of generating labeled autonomous vehicle data. Perception subsystem 554 may be configured to detect, track, classify, and/or determine objects within the environment surrounding autonomous vehicle 500. Trajectory subsystem 556 is configured to generate a trajectory for autonomous vehicle 500 over a particular timeframe given a desired destination as well as the static and moving objects within the environment. A machine learning model in accordance with several implementations can be utilized in generating a vehicle trajectory. Control system interface 558 is configured to communicate with control system 510 in order to implement the trajectory of the autonomous vehicle 500. In some implementations, a machine learning model can be utilized to control an autonomous vehicle to implement the planned trajectory.

It will be appreciated that the collection of components illustrated in FIG. 5C for vehicle control system 520 is merely exemplary in nature. Individual sensors may be omitted in some implementations. In some implementations, different types of sensors illustrated in FIG. 5C may be used for redundancy and/or for covering different regions in an environment surrounding an autonomous vehicle. In some implementations, different types and/or combinations of control subsystems may be used. Further, while subsystems 552-558 are illustrated as being separate from processing logic 522 and memory 524, it will be appreciated that in some implementations, some or all of the functionality of subsystems 552-558 may be implemented with program code such as instructions 526 resident in memory 524 and executed by processing logic 522, and that these subsystems 552-558 may in some instances be implemented using the same processor(s) and/or memory. Subsystems in some implementations may be implemented at least in part using various dedicated circuit logic, various processors, various field programmable gate arrays ("FPGA"), various application-specific integrated circuits ("ASIC"), various real time controllers, and the like, as noted above, multiple subsystems may utilize circuitry, processors, sensors, and/or other components. Further, the various components in vehicle control system 520 may be networked in various manners.

In some implementations, different architectures, including various combinations of software, hardware, circuit logic, sensors, and networks may be used to implement the various components illustrated in FIG. 5C. Each processor may be implemented, for example, as a microprocessor and each memory may represent the random access memory ("RAM") devices comprising a main storage, as well as any supplemental levels of memory, e.g., cache memories, non-volatile or backup memories (e.g., programmable or flash memories), or read-only memories. In addition, each memory may be considered to include memory storage physically located elsewhere in autonomous vehicle 500, e.g., any cache memory in a processor, as well as any storage capacity used as a virtual memory, e.g., as stored on a mass storage device or another computer controller. Processing logic 522 illustrated in FIG. 5C, or entirely separate processing logic, may be used to implement additional functionality in autonomous vehicle 500 outside of the purposes of autonomous control, e.g., to control entertainment systems, to operate doors, lights, or convenience features.

In addition, for additional storage, autonomous vehicle 500 may also include one or more mass storage devices, e.g., a removable disk drive, a hard disk drive, a direct access storage device ("DASD"), an optical drive (e.g., a CD drive, a DVD drive), a solid state storage drive ("SSD"), network attached storage, a storage area network, and/or a tape drive, among others. Furthermore, autonomous vehicle 500 may include a user interface 564 to enable autonomous vehicle 500 to receive a number of inputs from a passenger and generate outputs for the passenger, e.g., one or more displays, touchscreens, voice and/or gesture interfaces, buttons and other tactile controls. In some implementations, input from the passenger may be received through another computer or electronic device, e.g., through an app on a mobile device or through a web interface.

In some implementations, autonomous vehicle 500 may include one or more network interfaces, e.g., network interface 562, suitable for communicating with one or more networks 570 (e.g., a Local Area Network ("LAN"), a wide area network ("WAN"), a wireless network, and/or the Internet, among others) to permit the communication of information with other computers and electronic devices, including, for example, a central service, such as a cloud service, from which autonomous vehicle 500 receives environmental and other data for use in autonomous control thereof. In some implementations, data collected by one or more sensors 533A-533I can be uploaded to computing system 572 through network 570 for additional processing.

In such implementations, a time stamp can be associated with each instance of vehicle data prior to uploading.

Processing logic 522 illustrated in FIG. 5C, as well as various additional controllers and subsystems disclosed herein, generally operates under the control of an operating system and executes or otherwise relies upon various computer software applications, components, programs, objects, modules, or data structures, as may be described in greater detail below. Moreover, various applications, components, programs, objects, or modules may also execute on one or more processors in another computer coupled to autonomous vehicle 500 through network 570, e.g., in a distributed, cloud-based, or client-server computing environment, whereby the processing required to implement the functions of a computer program may be allocated to multiple computers and/or services over a network.

Routines executed to implement the various implementations described herein, whether implemented as part of an operating system or a specific application, component, program, object, module or sequence of instructions, or even a subset thereof, will be referred to herein as "program code." Program code typically comprises one or more instructions that are resident at various times in various memory and storage devices, and that, when read and executed by one or more processors, perform the steps necessary to execute steps or elements embodying the various aspects of the invention. Moreover, while implementations have and hereinafter may be described in the context of fully functioning computers and systems, it will be appreciated that the various implementations described herein are capable of being distributed as a program product in a variety of forms, and that implementations can be implemented regardless of the particular type of computer readable media used to actually carry out the distribution. Examples of computer readable media include tangible, non-transitory media such as volatile and non-volatile memory devices, floppy and other removable disks, solid state drives, hard disk drives, magnetic tape, and optical disks (e.g., CD-ROMs, DVDs) among others.

In addition, various program code described hereinafter may be identified based upon the application within which it is implemented in a specific implementation. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets), it should be appreciated that the invention is not limited to the specific organization and allocation of program functionality described herein.

Those skilled in the art, having the benefit of the present disclosure, will recognize that the exemplary environment illustrated in FIG. 5C is not intended to limit implementations disclosed herein. Indeed, those skilled in the art will recognize that other alternative hardware and/or software environments may be used without departing from the scope of implementations disclosed herein.

In implementations of this disclosure, visible light may be defined as having a wavelength range of approximately 380 nm-700 nm. Non-visible light may be defined as light having wavelengths that are outside the visible light range, such as ultraviolet light and infrared light. Infrared light having a wavelength range of approximately 700 nm-1 mm includes near-infrared light. In aspects of this disclosure, near-infrared light may be defined as having a wavelength range of approximately 700 nm-1.6 μm.

In aspects of this disclosure, the term "transparent" may be defined as having greater than 90% transmission of light. In some aspects, the term "transparent" may be defined as a material having greater than 90% transmission of visible light.

The term "processing logic" in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the processing logic to store instructions to execute operations and/or store data. Processing logic may also include analog or digital circuitry to perform the operations in accordance with embodiments of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

Networks may include any network or network system such as, but not limited to, the following: a peer-to-peer network; a Local Area Network (LAN); a Wide Area Network (WAN); a public network, such as the Internet; a private network; a cellular network; a wireless network; a wired network; a wireless and wired combination network; and a satellite network.

Communication channels may include or be routed through one or more wired or wireless communication utilizing IEEE 802.11 protocols, BlueTooth, SPI (Serial Peripheral Interface), I²C (Inter-Integrated Circuit), USB (Universal Serial Port), CAN (Controller Area Network), cellular data protocols (e.g. 3G, 4G, LTE, 5G), optical communication networks, Internet Service Providers (ISPs), a peer-to-peer network, a Local Area Network (LAN), a Wide Area Network (WAN), a public network (e.g. "the Internet"), a private network, a satellite network, or otherwise.

A computing device may include a desktop computer, a laptop computer, a tablet, a phablet, a smartphone, a feature phone, a server computer, or otherwise. A server computer may be located remotely in a data center or be stored locally.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A light detection and ranging (LIDAR) device comprising:
   a substrate layer;
   a cladding layer disposed on the substrate layer;
   a waveguide configured for propagating light, wherein at least a portion of the waveguide runs through the cladding layer; and
   an ohmic element, wherein at least a portion of the ohmic element runs through the cladding layer, wherein the waveguide is disposed within the cladding layer between the ohmic element and the substrate layer, and wherein the ohmic element is arranged to impart heat to the waveguide in response to an electrical current that is provided to the ohmic element;
   wherein a frequency of the light propagating through the waveguide is modulated by the electrical current provided to the ohmic element.

2. The LIDAR device of claim 1, wherein the waveguide is selectively heated and cooled based on an amount of the heat imparted to the waveguide from the ohmic element.

3. The LIDAR device of claim 1, wherein an infrared transmit beam is configured to propagate through the waveguide and into an external environment of the LIDAR device.

4. The LIDAR device of claim 1, further comprising:
   a heat module coupled to the ohmic element, wherein the heat module is configured to drive the electrical current that is provided to the ohmic element.

5. The LIDAR device of claim 4, wherein the heat module is coupled to a first portion of the ohmic element and a second portion of the ohmic element that is opposite the first portion of the ohmic element.

6. The LIDAR device of claim 4, wherein the heat module comprises one or more transistors.

7. The LIDAR device of claim 1, wherein the light propagating through the waveguide is infrared light.

8. The LIDAR device of claim 1, wherein the substrate layer includes an opening that is disposed relative to the waveguide to assist in controlling a temperature of the waveguide.

9. The LIDAR device of claim 8, further comprising a filler material disposed in the opening, wherein a thermal conductivity of the filler material is selected to adjust a heat dissipation rate of the waveguide.

10. The LIDAR device of claim 9, wherein the opening is at least partially filled with a filler material having a thermal conductivity that is between 0.025 W/mK and 500 W/mK.

11. The LIDAR device of claim 9, wherein the opening is at least partially filled with a filler material having a thermal conductivity that is between 0.1 W/mK and 20 W/mK.

12. The LIDAR device of claim 8, wherein the waveguide is disposed between the ohmic element and the opening, and wherein a portion of the cladding layer is disposed between the waveguide and the ohmic element.

13. An autonomous vehicle control system for an autonomous vehicle, the autonomous vehicle control system comprising:
   a light detection and ranging (LIDAR) device including:
      a substrate layer;
      a cladding layer disposed on the substrate layer,
      a waveguide configured for propagating an infrared transmit beam into an external environment of the autonomous vehicle, wherein at least a portion of the waveguide runs through the cladding layer; and
      an ohmic element, wherein at least a portion of the ohmic element runs through the cladding layer, wherein the waveguide is disposed within the cladding layer between the ohmic element and the substrate layer, and wherein the ohmic element is arranged to impart heat to the waveguide in response to an electrical current that is provided to the ohmic element;
      wherein a frequency of the infrared transmit beam propagating through the waveguide is modulated by the electrical current provided to the ohmic element; and
   one or more processors configured to control the autonomous vehicle in response to an infrared returning beam that is a reflection of the infrared transmit beam.

14. The autonomous vehicle control system of claim 13, wherein the LIDAR device comprises a heat module coupled to a first portion of the ohmic element and a second portion of the ohmic element that is opposite the first portion of the ohmic element, wherein the heat module is configured to drive the electrical current that is provided to the ohmic element.

15. The autonomous vehicle control system of claim 14, wherein the heat module comprises one or more transistors.

16. The autonomous vehicle control system of claim 13, wherein the substrate layer includes an opening that is disposed relative to the waveguide to assist in controlling a temperature of the waveguide.

17. The autonomous vehicle control system of claim 16, further comprising a filler material disposed in the opening, wherein a thermal conductivity of the filler material is selected to adjust a heat dissipation rate of the waveguide.

18. An autonomous vehicle comprising:
   a light detection and ranging (LIDAR) sensor including:
      a substrate layer;
      a cladding layer disposed on the substrate layer, a waveguide configured for propagating an infrared transmit beam into an external environment of the autonomous vehicle, wherein at least a portion of the waveguide runs through the cladding layer; and
      an ohmic element, wherein at least a portion of the ohmic element runs through the cladding layer, wherein the waveguide is disposed within the cladding layer between the ohmic element and the substrate layer and wherein the ohmic element is arranged to impart heat to the waveguide in response to an electrical current that is provided to the ohmic element; and
      wherein a frequency of the infrared transmit beam propagating through the waveguide is modulated by the electrical current provided to the ohmic element; and
   a control system configured to control the autonomous vehicle in response to an infrared returning beam that is a reflection of the infrared transmit beam.

19. The autonomous vehicle of claim 18, wherein the LIDAR sensor comprises a heat module coupled to a first portion of the ohmic element and a second portion of the ohmic element that is opposite the first portion of the ohmic element, wherein the heat module is configured to drive the electrical current that is provided to the ohmic element.

20. The autonomous vehicle of claim 18, wherein:
   the substrate layer includes an opening that is disposed relative to the waveguide to assist in controlling a temperature of the waveguide; and
   the LIDAR sensor comprises a filler material disposed in the opening, wherein a thermal conductivity of the filler material is selected to adjust a heat dissipation rate of the waveguide.

* * * * *